(12) United States Patent
Nuriya

(10) Patent No.: US 10,251,285 B2
(45) Date of Patent: Apr. 2, 2019

(54) ELECTRONIC APPARATUS UNIT

(71) Applicant: Mitsubishi Electric Corporation, Tokyo (JP)

(72) Inventor: Nobuaki Nuriya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/842,987

(22) Filed: Dec. 15, 2017

(65) Prior Publication Data

US 2018/0213658 A1 Jul. 26, 2018

(30) Foreign Application Priority Data

Jan. 24, 2017 (JP) .................................. 2017-010364

(51) Int. Cl.
*H05K 5/00* (2006.01)
*H05K 5/02* (2006.01)
(Continued)

(52) U.S. Cl.
CPC ......... *H05K 5/0052* (2013.01); *H01R 13/516* (2013.01); *H05K 5/006* (2013.01); *H05K 5/0008* (2013.01); *H05K 5/0056* (2013.01); *H05K 5/0213* (2013.01); *H05K 5/03* (2013.01); *H05K 7/20445* (2013.01); *H01R 12/7064* (2013.01); *H01R 12/724* (2013.01); *H01R 12/727* (2013.01); *H01R 13/5202* (2013.01)

(58) Field of Classification Search
CPC .... H05K 5/0052; H05K 5/008; H05K 5/0056; H05K 5/0213; H05K 5/03; H05K 7/20445; H01R 13/516; H01R 12/7064; H01R 12/724; H01R 12/727; H01R 13/5202

USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236

See application file for complete search history.

(56) References Cited

U.S. PATENT DOCUMENTS 6,155,856 A * 12/2000 Sanada ................. B60T 8/3675
439/246
6,616,480 B2 * 9/2003 Kameyama .......... H01R 13/521
439/271

(Continued)

FOREIGN PATENT DOCUMENTS

JP 2007-073764 A 3/2007
JP 2013-4611 A 1/2013

*Primary Examiner* — Robert J Hoffberg
*Assistant Examiner* — Razmeen Gafur
(74) *Attorney, Agent, or Firm* — Sughrue Mion, PLLC; Richard C. Turner

(57) ABSTRACT

A second seal material is coated on an annular seal surface constituted by a partition wall of a connector housing and a three-sided outer peripheral surface of a cover, and is joined with an annular base outer peripheral surface on the base, and the cover and the base are integrated with fastening screws at the four corners, and hold the three sides of a circuit board therebetween. Fastening surfaces of the base are embossed with a first depth so that bending strength is reinforced whereby a stable seal gap is generated, and corner outer walls and a connection outer wall are disposed at four corners and one side of the cover, so as to generate a retention gap to prevent outflow of the second seal material.

12 Claims, 6 Drawing Sheets

(51) Int. Cl.
*H05K 5/03* (2006.01)
*H05K 7/20* (2006.01)
*H01R 12/70* (2011.01)
*H01R 12/72* (2011.01)
*H01R 13/52* (2006.01)
*H01R 13/516* (2006.01)

(56) References Cited

U.S. PATENT DOCUMENTS

| | | | | |
|---|---|---|---|---|
| 6,719,327 B2* | 4/2004 | Yamaguchi | | B62J 23/00 |
| | | | | 280/833 |
| 6,882,539 B2* | 4/2005 | Koike | | H05K 5/0043 |
| | | | | 361/752 |
| 7,210,962 B2* | 5/2007 | Kameyama | | H01R 13/5208 |
| | | | | 439/589 |
| 7,364,438 B2* | 4/2008 | Sasaki | | H05K 5/063 |
| | | | | 361/752 |
| 7,736,158 B2* | 6/2010 | Yamaguchi | | H05K 7/026 |
| | | | | 439/271 |
| 7,871,299 B2* | 1/2011 | Kawasaki | | H01R 13/5219 |
| | | | | 439/669 |
| 8,167,634 B2* | 5/2012 | Fujiwara | | H01R 13/5202 |
| | | | | 439/271 |
| 8,449,202 B2* | 5/2013 | Shimotsu | | G02B 6/3883 |
| | | | | 385/101 |
| 8,454,329 B2* | 6/2013 | Taguchi | | F04C 18/0215 |
| | | | | 310/71 |
| 8,520,397 B2* | 8/2013 | Azumi | | H05K 5/0052 |
| | | | | 361/730 |
| 8,970,700 B2* | 3/2015 | Inoue | | H04N 5/2252 |
| | | | | 348/148 |
| 9,091,297 B2* | 7/2015 | Morishige | | F16C 17/04 |
| 9,150,172 B2* | 10/2015 | Matsuda | | B60L 11/18 |
| 9,312,626 B2* | 4/2016 | Itsuki | | H01R 13/5208 |
| 9,332,668 B2* | 5/2016 | Nishio | | H01R 13/42 |
| 9,356,494 B2* | 5/2016 | Motoda | | H02K 5/225 |
| 9,397,431 B2* | 7/2016 | Hirayanna | | H01R 13/405 |
| 9,499,100 B2* | 11/2016 | Iba | | B60R 1/072 |
| 9,618,035 B2* | 4/2017 | Morishige | | F16C 17/107 |
| 9,930,781 B2* | 3/2018 | Takai | | H05K 1/141 |
| 9,985,493 B2* | 5/2018 | Nagumo | | H02K 5/20 |
| 2010/0248606 A1* | 9/2010 | Kanda | | B60H 1/00857 |
| | | | | 454/145 |
| 2013/0147293 A1* | 6/2013 | Sakurada | | H02K 5/225 |
| | | | | 310/71 |
| 2015/0099385 A1* | 4/2015 | Ikeya | | H01R 12/724 |
| | | | | 439/271 |
| 2018/0082809 A1* | 3/2018 | Shinohara | | H01H 21/12 |
| 2018/0183162 A1* | 6/2018 | Sakamoto | | H01R 12/714 |
| 2018/0239054 A1* | 8/2018 | Mizusaki | | G01P 1/02 |
| 2018/0245573 A1* | 8/2018 | Maruo | | B60T 13/686 |

* cited by examiner

ELECTRONIC APPARATUS UNIT

BACKGROUND OF THE INVENTION

1. Field of the Invention

The present invention relates to an improvement of a waterproof type electronic apparatus unit which is suitable for an on-vehicle electronic control apparatus installed in an engine compartment, for example.

2. Description of the Related Art

There is a waterproof type electronic apparatus unit configured to house a circuit board, on which a plurality of circuit components and a connector housing (tall component) are mounted, in a sealed case body, allowing a part of the connector housing to be exposed from the case body so as to connect with a mating connector. The case body that houses this electronic apparatus unit is constituted by a case having a space to house the circuit board and a flat cover which covers the case, where the case and the flat cover are secured by screws, or is constituted by a flat base, on which the circuit board is mounted, and a deep cover which covers the base. Mounting legs are installed on either the case or the base and fixed to the mounted surface by set screws. A waterproof seal material is applied to the surfaces joining the base (or the case), the cover and the connector housing, and a water repellent filter is disposed on the inner surface of the base (or the case). This water repellent filter is configured to prevent the entry of water drops into the case body, and is constituted by a flat porous material including a plurality of micro-pores which allow the free passage of air, so that the air inside the case body is open to the outside air, in order to prevent the deformation of the case body structure or damage to the air tight seal structure, which is caused by the atmospheric pressure difference between the inside and the outside of the case body, due to an increase in the temperature of the components that heat up inside the case body.

For example, according to FIG. 1, FIG. 3 and FIG. 7 of the "board housing case body of on-vehicle electronic apparatus" disclosed in Japanese Patent Application Laid-open No. 2013-004611, the circuit board 40, on which the connector housing 41 is mounted, is sealed hermetically inside the board housing case body 10 constituted by a base 30 (made of sheet metal) and a cover 20 (made of sheet metal), the mounting legs 31 and 32 are disposed on the base 30 and are fixed to the mounted source (not illustrated), and the cover 20 is integrated with the base 30 by bending the bending pieces 25a to 25d disposed at four corners of the cover 20. It is stated that four screws may be used instead of the bending pieces 25a to 25d (see paragraph [0050]), but the circuit board 40 is held at three sides between the base 30 and the cover 20. In Japanese Patent Application Laid-open No. 2013-004611, it is disclosed that the connector housing 41 is disposed between the circuit board 40 and the cover 20, and an aluminum die cast cover may be used instead of the sheet metal cover (see paragraph [0049]).

According to FIG. 2 and FIG. 3 of the "electronic circuit unit" disclosed in Japanese Patent Application Laid-open No. 2007-073764, the circuit board is constituted by a waterproof case 2 which houses the circuit board in a waterproofed state, a base member 6 (made of metal) which front surface supports the rear surface of the circuit board, and a cover member 7 (made of resin) which covers the front surface of the circuit board and is fixed to the base member 6, and a rear surface 6f of the base member 6 is exposed so that the heat generated from the electronic components 4 on the circuit board 3 transfers through the base member 6 and is discharged from the rear surface 6f, thereby the heat in the circuit board in the waterproofed state can be dissipated satisfactorily. The cover member 7 is outsert-molded and fixed to the circuit board 3 and the base member 6, which are in a mutually fixed state, and the resin constituting the cover member 7 is thermoplastic polymeric resin, which is suitable for outsert-molding (see paragraph [0017]).

SUMMARY OF THE INVENTION (1) Problems of prior art

In the case body disclosed in Japanese Patent Application Laid-open No. 2013-004611, a metal material is used for both the cover 20 and the base 30, in order to improve the heat dissipation capabilities, hence it is difficult to form a rough seal surface between the connector housing 41 and the cover 20, and the size of the case body increases. Further, the cover 20 and the base 30 are integrated via the bending pieces 25a to 25d (or screws), so that the circuit board 40 is held between the cover 20 and the base 30, hence operability during assembly is good, but unless the bend strength of the contour outer periphery portions 23 and 33 of the cover 20 and the base 30 are high, it is difficult to secure a stable seal surface gap by pressing and adjusting the curved circuit board 40 and holding the circuit board 40 between the cover 20 and the base 30 with certainty. Especially when a heating source exists outside the cover 20 and a resin mold material is used for the cover 20 in order to prevent receiving the radiant heat from the heating source, the strength of the cover 20 and the base 30 to press and hold the circuit board 40 and obtain a stable seal gap becomes insufficient unless the thickness dimensions of the cover 20 and the base 30 are increased, which makes it impossible to decrease the weight of the case body.

In the case of the electronic circuit unit disclosed in Japanese Patent Application Laid-open No. 2007-073764, the cover member 7 (made of thermoplastic resin), which houses the circuit board 3 on which the electronic component 4 and the connector 5 are mounted, and the base member 6 (made of aluminum), are integrated by mold filling using a thermoplastic polymeric resin. Therefore, an outsert-molding machine, to mold the resin, is required in the assembly step, and use of mold filing is inappropriate for such an environment as an engine compartment of an automobile, where such problems as solder peeling off electronic components due to heat and vibration, or separation and falling off of the base and cover are possible. Further, in this electronic circuit unit, the cover and the connector are integrally molded, hence when the circuit board size is changed, the die of the connector portion must be recreated, so here a general purpose connector cannot be used.

(2) Object of the Invention

With the foregoing in view, it is an object of the invention to provide an electronic apparatus unit, by which the weight of the electronic apparatus unit can be decreased, assembly thereof is improved, and a stable waterproof seal gap can be acquired.

An electronic apparatus of this invention is a waterproof type electronic apparatus unit including: a connector housing made of resin and including an opening portion and a body portion through which a mating connector is inserted/extracted; and a partition wall having a trapezoidal cross-section into which a plurality of connection terminals are press-fitted. The connector housing is connected to a first side of a circuit board, with ends on one side of the connection terminals being bent toward a long bottom side of the partition wall. The circuit board is sealed in an approximately square case body constituted by a base made of sheet metal, which has mounting legs on a third side and a fourth side intersecting orthogonally with the first side; and a cover (made of resin). An end face opening portion, which is a first side of the cover, has a trapezoidal shape, three surfaces of the trapezoid on the oblique sides and the short top side of the trapezoidal shape are joined with the oblique sides and the short top side of the partition wall via a first seal material, and a second seal material is annularly applied to the long bottom side of the partition wall and the three-sided outer peripheral surface on the cover, so as to join with an annular base outer peripheral surface on the base. The circuit board is held between a shelf portion disposed on the three-sided outer peripheral surface of the cover and the base outer peripheral surface. The base includes: a base bottom surface generated by embossing a center portion of a rectangular sheet metal material to be an approximately square-shaped with a second depth D2; a flange-shaped base outer peripheral surface, which is a contour reference surface of the base bottom surface; and the mounting legs which are generated by bending base opposite sides, which are the third side and the fourth side of the base outer peripheral surface, in a direction toward the base bottom surface, with a third depth D3.

Each of the fastening surfaces disposed on the four corners of the base outer peripheral surface has a fastening hole, into which a fastening screw is insert for holding the three sides of the circuit board, excluding the first side, between the cover and the base. The fastening surfaces are embossed toward a direction opposite to the base bottom surface 116 with a first depth D1, to contact the fastening mating surfaces disposed on the cover, thereby generating a seal gap G0 of the second seal material. The cover includes: the three-sided outer peripheral surface, excluding the end surface opening portion; fastening screw holes into which the fastening screws are screwed; and an outer wall. The outer walls include: corner outer walls which face the two surfaces on the outer periphery of the fastening surfaces; and a connection outer wall disposed between a pair of corner outer walls located on the opposite sides of the end surface opening portion, out of the corner walls. The corner housing includes an annular outer wall which faces the first side of the base and the surface opening portion of the cover. The first side and the second side, which is opposite the first side, of the base constitute a retention gap G1 with respectively the annular outer wall and the outer wall, so as to prevent outflow of the second seal material. The annular outer wall constitutes a retention gap G1 with the end surface opening portion of the cover, so as to prevent outflow of the first seal material.

As described above, according to the electronic apparatus unit of this invention, the circuit board, which is a resin molded product, on which the connector housing is mounted, is housed in a sealed case body constituted by the base (made of sheet metal) and the cover (made of resin), and a step difference having the first depth D1 is formed between the mutual fastening surfaces disposed on the four corners of the base and the cover and the base outer peripheral surface which presses against the three sides of the circuit board, and the retention gap G1 of the seal material is generated with the base (sheet metal material) by the connection outer wall, the corner outer wall and the annular outer wall, which are disposed in the cover (molded material) and the connector housing. This electronic apparatus unit includes a pair of mounting legs, which is generated by bending, on both sides of the base opposite side parallel with the insertion/extraction direction of the mating connector.

Therefore the fastening surface of the base can have a planar strength by the bending processing at the first depth D1, and the fastening surface of the base can be pressed against the fastening mating surface of the cover while pressing and adjusting the three sides of the curved circuit board, whereby the seal gap of the second seal material can be precisely controlled, and an inexpensive and light weight electronic apparatus unit can be obtained using thin sheet metal material. If the seal gap G0 of the second seal material is appropriate, and if it is set such that an appropriate amount of seal material can flow into the retention gap G1, then an abnormal state can be detected when the outer peripheral surfaces of the base or the cover are deformed and the seal gap G0 is not created evenly, by detecting no outflow of the seal material into the retention gap G1 in the widened seal gap portion. Further, the outflow of the seal material is blocked by the connection outer wall, the corner outer wall and the annular outer wall, therefore the seal path (immersion prevention path length) of the second seal material can be extended and the width of the base outer peripheral surface can be controlled, whereby at least the width of the side intersecting orthogonally to the base opposite side can be decreased, and a smaller and lighter electronic apparatus unit can be implemented.

DESCRIPTION OF THE PREFERRED EMBODIMENTS

Figure 1:
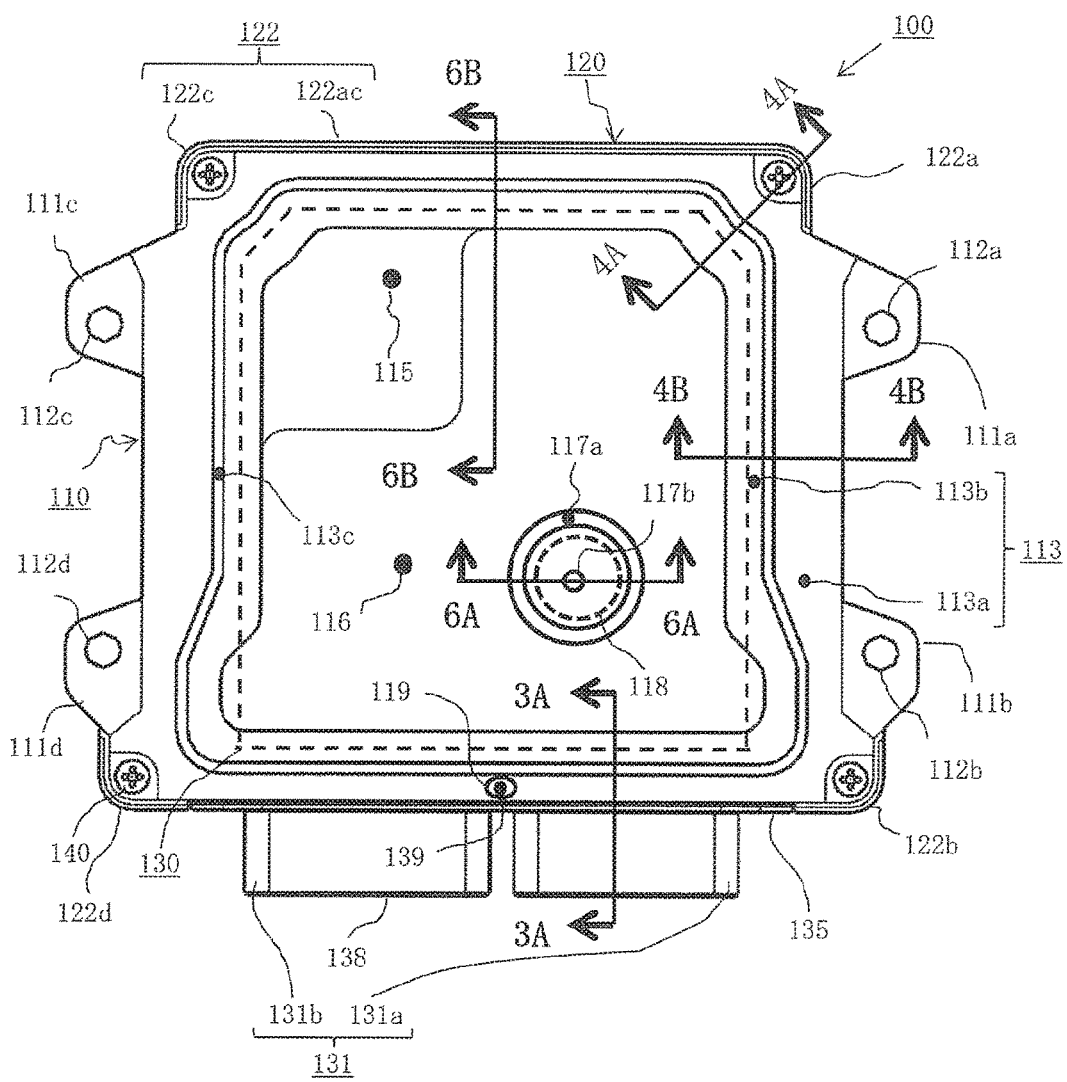
FIG. 1 is an external view of the rear surface of an electronic apparatus unit according to an embodiment of this invention.

Embodiment 1
(1) Detailed description of the configuration
The configuration of an electronic apparatus unit according to one embodiment of this invention will be described in sequence with reference to: FIG. 1 which is an external view of the rear surface of the electronic apparatus unit, FIG. 2A which is inside plan view of FIG. 1 before applying a second seal material, FIG. 2B which is an inside plan view of FIG.

Figure 3A:
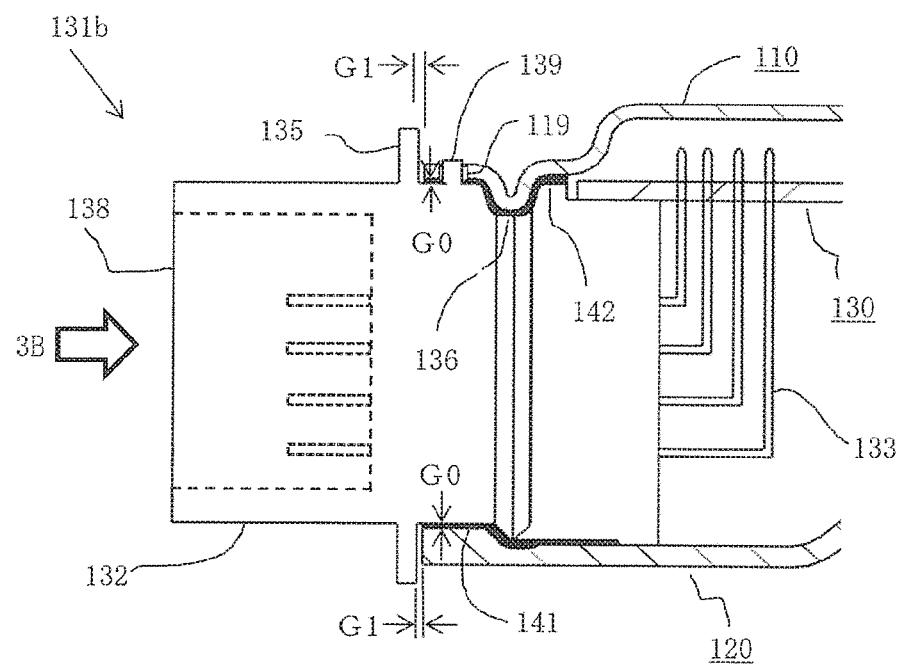
FIG. 3A is a partial cross-sectional view sectioned at the 3A-3A line indicated by the arrow marks in FIG. 1.
Figure 3B:
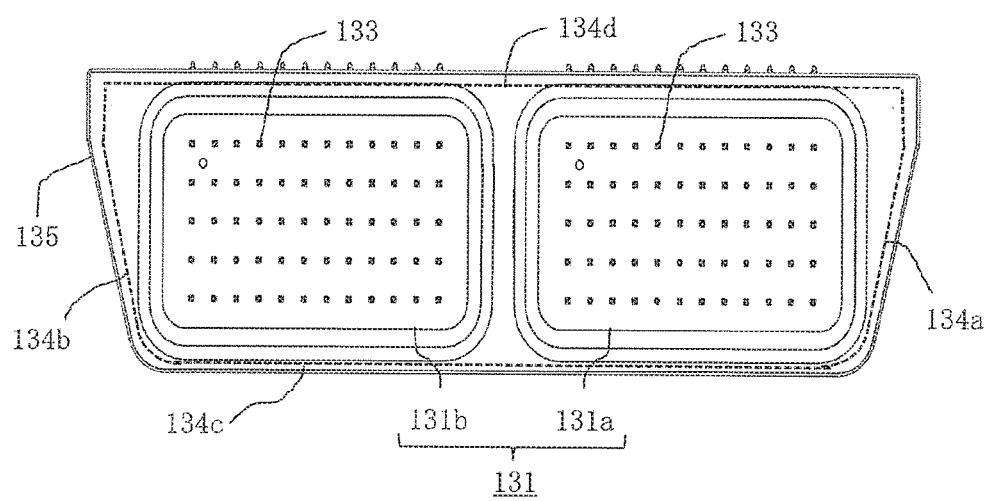
FIG. 3B is an end view of the connector housing indicated by the arrow mark 3B in FIG. 3A.

1 after applying the second seal material, FIG. 3A which is a partial cross-sectional view sectioned at the 3A-3A line indicated by the arrow marks in FIG. 1, and FIG. 3B which is an end view of a connector housing indicated by the arrow mark 3B in FIG. 3A. As depicted in FIG. 1, the electronic apparatus unit 100 is constituted by: a sealed case body in which the base 110 (made of sheet metal) having mounting legs 111a and 111b and mounting legs 111c and 111d on two sides in a second direction, which intersects orthogonally to a first direction that is an insertion/extraction direction of a mating connector (not illustrated), and a cover 120 (made of molded resin), are integrated by fastening screws 140 at four corners; and a circuit board 130, indicated by the dotted line, housed in this sealed case body. A part of the connector housing 131 (made of molded resin), mounted on one side of the circuit board 130, is exposed from the end face of the case body.

Figure 6A:
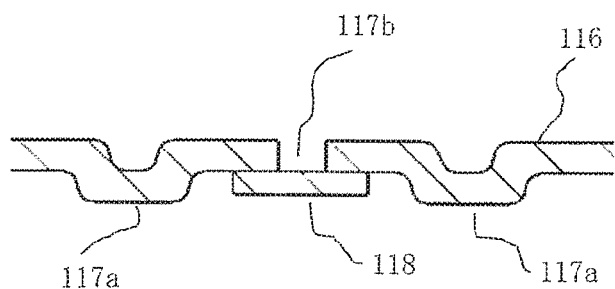
FIG. 6A is a partial cross-sectional view sectioned at the 6A-6A line indicated by the arrow marks in FIG. 1.

The connector housing 131 is divided into a first connector housing 131a and a second connector housing 131b, and the mating connector (not illustrated) is inserted into respective opening portions 138 thereof, so as to be connected to an external apparatus via the wire harness. In each of the mounting legs 111a to 111d disposed on two sides of the base 110, mounting holes 112a to 112d are disposed respectively, through which set screws (not illustrated) are inserted from the rear side when viewing FIG. 1, so as to secure the electronic apparatus unit to a mounted surface (not illustrated). A center portion of the square-shaped base 110 (made of sheet metal) is embossed in the direction from the rear side to the front side when viewing FIG. 1, whereby a base bottom surface 116 is generated, and a part of the base bottom surface 116 constitutes a shallow heat transfer pedestal 115, described later in FIG. 6B. A fringe type base outer peripheral surface 113 is formed on four sides of the base 110, and this base outer peripheral surface 113 is divided into an outside outer peripheral surface 113a and an inside outer peripheral surface 113b by an annular protruded line portion 113c, which is embossed in the direction from the front side to the rear side when viewing FIG. 1, and on the two sides of the outside outer peripheral surface 113a, the above mentioned mounting legs 111a to 111d are disposed in a state of being bent in the direction toward the base bottom surface 116 (direction from the rear side to the front side when viewing FIG. 1). The annular protruded portion 117a and an inlet 117b, described later in FIG. 6A, are disposed on the base bottom surface 116, and a water repellent filter 118 is adhered to the inner face thereof.

Figure 4A:
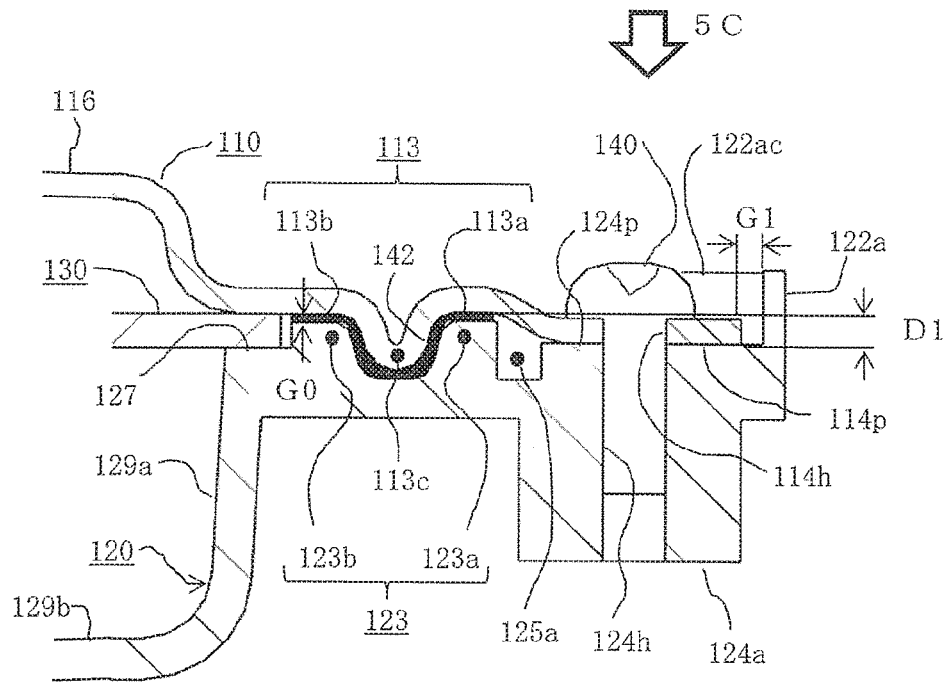
FIG. 4A is a cross-sectional view sectioned at the 4A-4A line indicated by the arrow marks in FIG. 1.
Figure 6B:
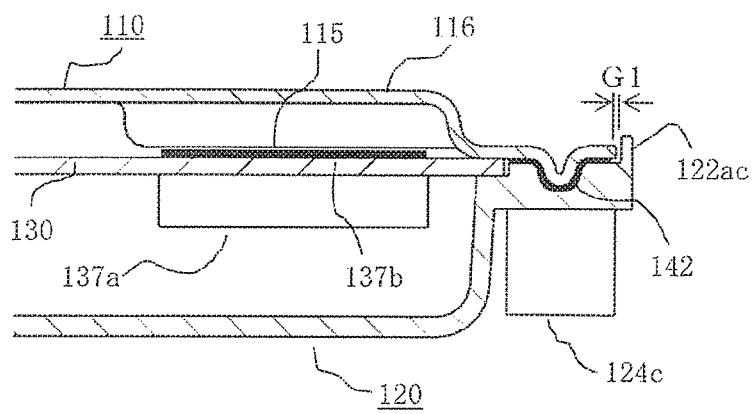
FIG. 6B is a partial cross-sectional view sectioned at the 6B-6B line indicated by the arrow marks in FIG. 1.

The cover 120, which is disposed on the rear side of the base 110 and is integrated with the base 110 by the fastening screws 140 at four corners, includes an outer wall 122 constituted by the corner outer walls 122a to 122d at four corners, and a connection outer wall 122ac which connects the corner outer wall 122a and the corner outer wall 122c, and faces a thick end face of the base 110 (described later in FIG. 4A and FIG. 6B). The connection outer wall 122ac is disposed on the second side, which is the opposite side of the first side where the connector housing 131 is mounted. As described later in FIG. 3A and FIG. 3B, a fitting hole 119 is formed on the first side of the cover 120, and a positioning protrusion 139 is formed on the long bottom side portion 134d of the connector housing 131, which are inter-fitted.

Figure 2A:
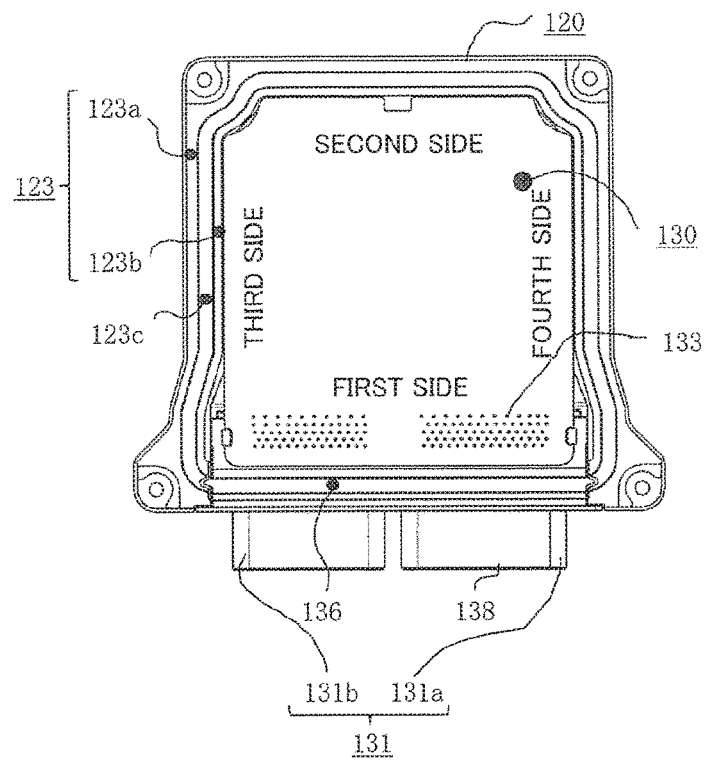
FIG. 2A is an inside plan view of FIG. 1 before applying a second seal material.
Figure 2B:
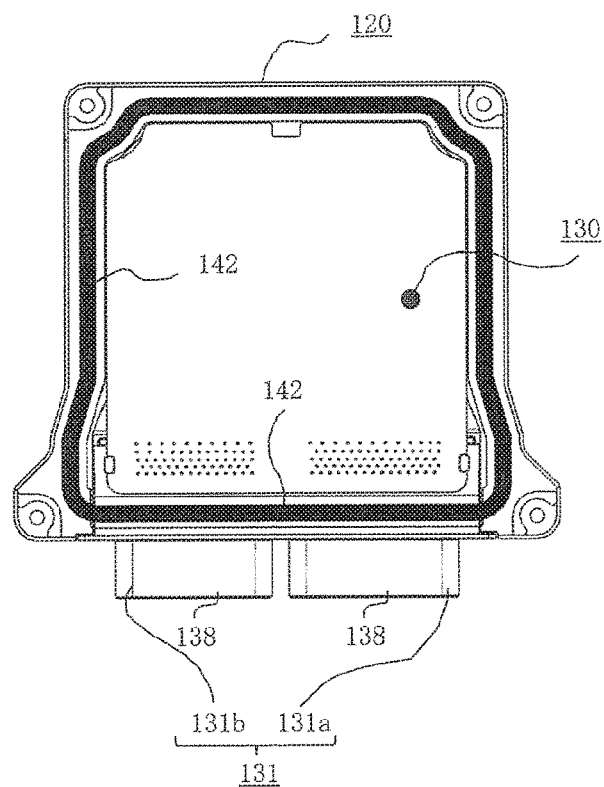
FIG. 2B is an inside plan view of FIG. 1 after applying the second seal material.

In FIG. 2A and FIG. 2B, which are inside views of the electronic apparatus unit 100 in FIG. 1A in which the base 110 is not illustrated, the rear surface of the circuit board 130 is primarily illustrated. The connector housing 131 is mounted on the front side (rear side when viewing the figures) of the first side of the circuit board 130, and a plurality of connection terminals 133 are connected by soldering from the rear side (front side when viewing the figures) of the circuit board 130). The three-sided outer peripheral surface 123 of the cover 120 has a cover outer peripheral surface 123a and a cover inner peripheral surface 123b which are divided by the three-sided recessed line portion 123c, and the three surfaces of the circuit board 130 are mounted on a shelf portion 127 (see FIG. 4A) formed on the cover inner peripheral surface 123b. On the long bottom side portion 134d (see FIG. 3B) of the connector housing 131, a bottom side recessed line portion 136 (see FIG. 3A) is formed, and the bottom side recessed line portion 136 and the three-sided recessed line portion 123c of the cover 120 constitute an annular recessed line portion, where the second seal material 142, illustrated in FIG. 2B, is applied annularly. The annular protruded line portion 113c of the base 110, described above in FIG. 1, is fitted into the annular recessed line portion on which the second seal material 142 is applied, with a predetermined seal gap G0 (see FIG. 4A and FIG. 4B).

In FIG. 3A and FIG. 3B, the connector housing 131 is constituted by the first connector housing 131a and the second connector housing 131b, and each connector housing has a body portion 132 into which the mating connector (not illustrated) is inserted from the opening portion 138 and the partition wall into which a plurality of connection terminals 133 are press-fitted. The cross-section of the partition wall has a trapezoidal shape constituted by a pair of oblique side portions 134a and 134b, a short top side portion 134c, and a long bottom side portion 134d. The connection terminals 133 which penetrate through the partition wall are bent at a right angle toward the long bottom side portion 134d, and the tips thereof are soldered to the circuit board 130. The end face opening portion of the cover 120 also has the same trapezoidal shape as the partition wall of the connector housing 131, and is sealed by the connector housing 131 with the seal gap G0 on which the first seal material 141 is applied. Into the long bottom side portion 134d of the partition wall, on which the bottom side recessed line portion 136 is formed, one side of the annular protruded line portion 113c of the base 110 is fitted, and a second seal material 142 is applied to the seal gap G0. An annular outer wall 135 is disposed on the outer periphery in the center portion of the connector housing 131, and the annular outer wall 135 faces the end surface portion of the base 110 and the opening end surface portion of the cover 120 via the retention gap G1 respectively.

A part of the first seal material 141 and the second seal material 142, which are applied to the seal gap G0, flows out into the retention gap G1 when the cover 120 and the base 110 are correctly assembled, whereby it can be visually observed that an appropriate amount of seal material is applied, and the annular outer wall 135 has a height that prevents the outflow of excess seal material into the mating connector side. The positioning protrusion 139 disposed on the long bottom side portion 134d of the connector housing 131 fits into the fitting hole 119 disposed on one side of the cover 120, so as to control the relative positions of the connector housing 131 and the cover 120.

Figure 4B:
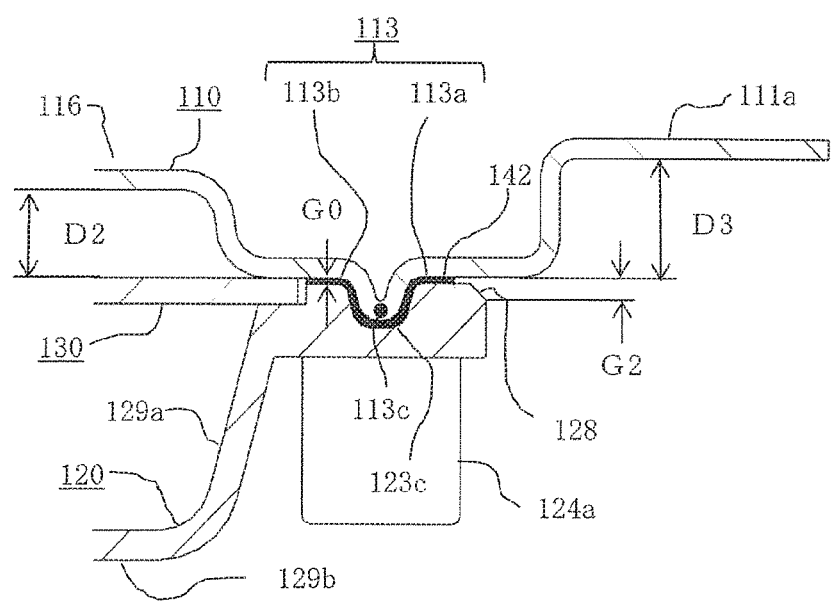
FIG. 4B is a cross-sectional view sectioned at the 4B-4B line indicated by the arrow marks in FIG. 1.

Next the configuration of the electronic apparatus unit will be described in sequence with reference to: FIG. 4A which is a cross-sectional view sectioned at the 4A-4A line indicated by the arrow marks in FIG. 1, FIG. 4B which is a cross-sectional view sectioned at the 4B-4B line indicated by the arrow marks in FIG. 1, FIG. 5A which is a plan view of a corner of a cover unit in FIG. 4A, FIG. 5B which is plan view of a corner of the base unit in FIG. 4A, FIG. 5C which is a plan view of a corner indicated by the arrow 5C in FIG. 4A, FIG. 6A which is a partial cross-sectional view sectioned at the 6A-6A line indicated by the arrow marks in FIG. 1, and FIG. 6B which is a partial cross-sectional view sectioned at the 6B-6B line indicated by the arrow marks in FIG. 1. In FIG. 4A and FIG. 4B, the cover 120 is constituted by a three-sided side wall 129a, a ceiling portion 129b, and a three-sided outer peripheral surface 123, and the three-sided outer peripheral surface 123 is divided into the cover outer peripheral surface 123a and the cover inner peripheral surface 123b by the three-sided recessed line portion 123c. On each of the four corners of the cover 120, screw hole tubular portions 124a to 124d (124b to 124d are not illustrated), which includes the fastening screw hole 124h and the fastening mating surface 124p, are disposed, and the partition grooves 125a to 125d (125b to 125d are not illustrated) are disposed between the screw hole tubular portions 124a to 124d and the cover outer peripheral surface 123a. Because of the partition grooves 125a to 125d, the generation of a sink in a thick portion can be prevented, so the flatness of the fastening surface improves, and in the case of applying a locking bond to the fastening screw 140, the partition grooves 125a to 125d can be used to accumulate bonding material.

The shelf portion 127, on which the circuit board 130 is mounted, is disposed on the cover inner peripheral surface 123b, and the corner outer walls 122a to 122d are disposed on the outer edge portions of the cover 120, and the corner outer walls 122a and 122c thereof are connected by the connection outer wall 122ac. The base 110 includes the base outer peripheral surface 113 which is formed as a fringe of the base bottom surface 116 at the second depth D2, and the base outer peripheral surface 113 is divided, by the annular protruded line portion 113c, into the outside outer peripheral surface 113a and the inside outer peripheral surface 113b. The three sides of the circuit board 130 are held between the inside outer peripheral surface 113b of the base 110 and the shelf portion 127 of the cover 120. The annular protruded line portion 113c of the base 110 and the three-sided recessed line portion 123c of the cover 120 face each other via the seal gap G0, and the second seal material 142 is applied to the seal gap G0. On each of the four corners of the base outer peripheral surface 113a, the fastening surface 114p having the fastening hole 114h is extended via a step difference having a first depth D1, and the fastening surface 114p and the fastening mating surface 124p, disposed on the cover 120, are fastened and fixed by the fastening screw 140.

The connection outer wall 122ac and the end face of the base 110 face each other via the retention gap G1 at the opposite side position of the opening end surface portion of the cover 120 (see FIG. 6B), so that a part of the second seal material 142 applied to the seal gap G0 flows out into the retention gap G1 when the cover 120 and the base 110 are correctly assembled, whereby it can be visually observed whether or not an appropriate amount of seal material is applied. A widened gap G2 is disposed on the second side and the third side of the cover 120 intersecting orthogonally to the end surface opening portion of the cover 120, so that a part of the second seal material 142 applied to the seal gap G0 flows out into the widened gap G2 when the cover 120 and the base 110 are correctly assembled, whereby it can be visually observed whether or not an appropriate amount of seal material is applied. The widened gap G2 is the chamfered outermost portion of the cover outer peripheral surface 123a, so that the maximum value of the widened gap G2 is twice or more the seal gap G0, and the mounting legs 111a and 111b, and the mounting legs 111c and 111d, having the third depth D3, are disposed parallel with the widened gap G2.

Figure 5A:
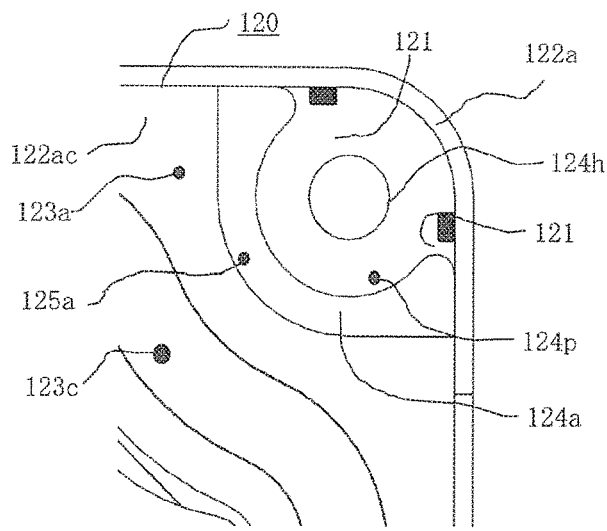
FIG. 5A is a plan view of a corner of a cover unit in FIG. 4A.
Figure 5B:
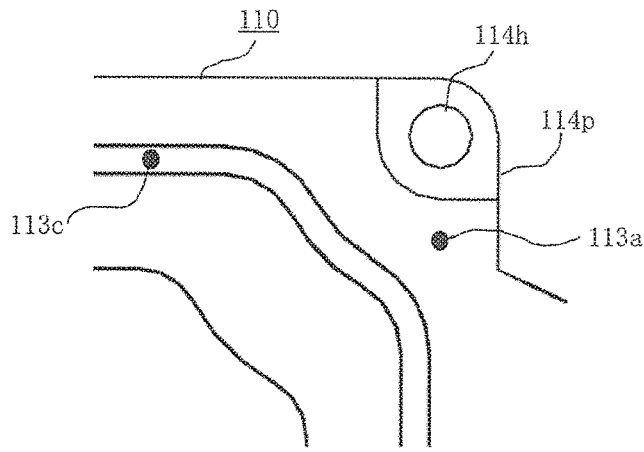
FIG. 5B is a plan view of a corner of a base unit in FIG. 4A.
Figure 5C:
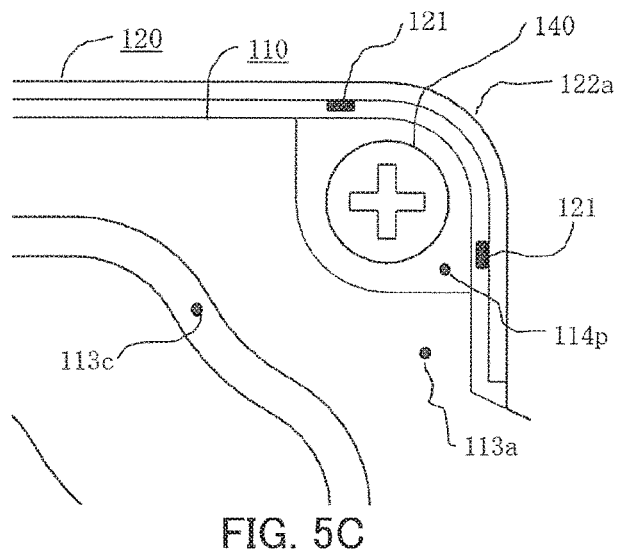
FIG. 5C is a plan view of a corner indicated by the arrow 5C in FIG. 4A.

In FIG. 5A, FIG. 5B and FIG. 5C, two loosening prevention protrusions 121 are disposed on the inner face of each corner outer wall 122a to 122d of the cover 120, into which each of the four corners of the base 110 is forced, whereby the loosening generated by the dimensional dispersions between the base 110 and the cover 120 can be prevented. The gap between the inner surface of the corner outer wall 122a to 122d of the cover 120 and the end surface of each of four corners of the base 110, where the loosening prevention protrusions 121 are disposed, can be larger than the retention gap G1. If the base 110 is forced as mentioned above, an excessive portion of the loosening prevention protrusion 121 (a resin molded material) is scrapped off, but it is sufficient that this loosening prevention protrusion 121 is disposed on the second side of the cover 120 (opposite side of the opening end surface portion), since the fitting hole 119 and the positioning protrusion 139, illustrated in FIG. 1 and FIG. 3A, are disposed between the base 110 and the connector housing 131. If the fitting hole 119 and the positioning protrusion 139 are not disposed, it is preferable that the loosening prevention protrusion 121 is disposed on all the inner surfaces of the corner outer walls 122a to 122d on four corners.

In FIG. 6A, the annular protruded portion 117a is disposed at the center portion inside the base bottom surface 116, and the circular water repellent filter 118 is adhered to the annular protruded portion 117a, and the inlet 117b, which is open to the outside air, is disposed on the rear surface position of the repellent filter 118. This water repellent filter 118 is made of a flat porous material, including a plurality of micro-pores through which air can freely pass, and is used to prevent the entry of water drops into the case body. In FIG. 6B, the heat transfer pedestal 115 is disposed on the base 110 at a position facing the heat-generating component 137a, which is mounted on the circuit board 130. This heat transfer pedestal 115 is disposed on one or on both of the pair of corners on a side where the connector housing 131 is not disposed, and the depth of the bottom surface of the heat transfer pedestal 115 is shallower than the base bottom surface 116, and the heat transfer adhesive 137b is applied to the inner bottom surface of the heat transfer pedestal 115 so as to join with the circuit board 130, on which the heat-generating component 137a is mounted.

In the above description, the two mounting legs 111a and 111b and the two mounting legs 11c and 111d are disposed on the left and right opposing sides of the base 110 respectively, but if the electronic apparatus unit is smaller and lighter, one mounting leg may be disposed on one side, and one or two mounting legs may be disposed on the other side. For example, if one of the mounting legs 111a and 111b in FIG. 1 is disposed at the center, the corner outer walls 122a and 122b of the cover 120 can be extended toward the center, so that the effective range of the retention gap G1 is increased. In the above description, the depth of the cover 120 is uniform, but a modified structure may be used, such as the ceiling surface of the end surface opening portion, where the connector housing 131 is mounted, is high and the rest of the ceiling surfaces are low. One of the requirements that is demanded for the electronic apparatus unit of this invention is that the connector housing and the cover are separate components, and even if the dimensions of the cover are changed depending on the size of the circuit board, the conventional connector housing produced by a conventional die can be used if the number of connecting wires is the same. Another requirement is that the connection terminal that is press-fitted into the connector housing is a right angle type, and the connection terminal can be deformed even if the length of the connection terminal changes in accordance with the ambient temperature, so that excessive stress is not generated in the portions soldered to the circuit board.

Still another requirement is that a conductive metal material is used for the base having the mounting legs, so that the heat from the heat-generating components is transferred to the base and then dissipated, and the cover is made of resin which makes the weight of the cover light and minimizes the influence of the radiant heat received from the outside. The basic configuration that satisfies the above requirements and is selected to implement a light electronic apparatus unit having heat resistance and vibration resistance is as follows. The base 110 is formed by pressing an aluminum plate of which thickness is 1.2 mm, for example, and the cover 120 is inject-molded to have a minimum thickness of 1.8 mm using thermoplastic resin. The circuit board 130 that is held between the base 110 and the cover 120 is constituted of double-sided glass epoxy board of which thickness is 1.6 mm, so as to increase the integration density of the circuit components, so that the dimensional relationship at least satisfies the minimal thickness of the cover 120≥thickness of the circuit board 130≥thickness of the base 110.

(2) Key points and features of embodiment

As described above, the electronic apparatus unit according to an embodiment of this invention is a waterproof type electronic apparatus unit 100 including a connector housing (made of resin) 131, and including: the opening portion 138 and the body portion 132 through which the mating connector is inserted/extracted; and the partition wall having a trapezoidal cross-section into which a plurality of connection terminals 133 are press-fitted. The connector housing 131 is connected to the first side of the circuit board 130, with ends on one side of connection terminals 133 being bent toward a long bottom side portion 134$d$ of the partition wall. The circuit board 130 is sealed in the approximately square case body constituted by the base (made of sheet metal) 110, which has the mounting legs 111$a$ to 111$d$ on the third side and the fourth side intersecting orthogonally to the first side, and the cover (made of resin) 120. An end surface opening portion, which is a first side of the cover 120, has a trapezoidal shape. The three surfaces of the trapezoid at the oblique sides and the short top side of the trapezoidal shape are joined with the oblique side portions 134$a$ and 134$b$ and the short top side of the partition wall via the first seal material 141, and the second seal material 142 is annularly applied to the long bottom side portion 134$d$ of the partition wall and the three-sided outer peripheral surface 123 on the cover 120, so as to join with the annular base outer peripheral surface 113 on the base 110. The circuit board 130 is held between the shelf portion 127 disposed on the three-sided outer peripheral surface 123 of the cover 120 and the base outer peripheral surface 113. The base 110 includes: the base bottom surface 116 generated by embossing the center portion of a rectangular sheet metal material to be an approximately square shape with the second depth D2; the flange-shaped base outer peripheral surface 113 which is the contour reference surface of the base bottom surface 116; and the mounting legs 111$a$ to 111$d$ which are generated by bending the base opposite sides, which are the third side and the fourth side of the base outer peripheral surface 113, in the direction toward the base bottom surface 116 with the third depth D3.

Each of the fastening surfaces 114$p$ disposed at the four corners of the base outer peripheral surface 113 has the fastening hole 114$h$, into which the fastening screw 140 is inserted, for holding the three sides of the circuit board 130 excluding the first side, between the cover 120 and the base 110. The fastening surfaces 114$p$ are embossed toward the direction opposite to the base bottom surface 116 with the first depth D1, contacting the fastening mating surface 124$p$ disposed on the cover 120, so as to generate the seal gap G0 of the second seal material 142. The cover 120 includes the three-sided outer peripheral surface 123, excluding the end surface opening portion, the fastening screw holes 124$h$ to screw in the fastening screws 140, and the outer wall 122. The outer wall 122 includes the corner outer walls 122$a$ to 122$d$ which face the two surfaces on the outer periphery of the fastening surfaces 114$p$, and the connection outer wall 122$ac$ disposed between the pair of corner outer walls 122$a$ and 122$c$, located on the opposite sides of the end surface opening portion, out of the corner outer walls 122$a$ to 122$d$. The connector housing 131 includes the annular outer wall 135, which faces the first side of the base 110 and the end surface opening portion of the cover 120. The first side and the second side, which is the opposite side of the first side, of the base 110 constitute the retention gap G1 with the annular outer wall 135 and the outer wall 122 respectively, so as to prevent the outflow of the second seal material 142. The annular outer wall 135 constitutes the retention gap G1 with the end surface opening portion of the cover 120, so as to prevent the overflow of the first seal material 141.

The base outer peripheral surface 113 is divided into the outside outer peripheral surface 113$a$ and the inside outer peripheral surface 113$b$ by the annular protruded line portion 113$c$, that is embossed in the direction opposite to the base bottom surface 116. The outside and the inside cover outer peripheral surfaces 123$a$ and 123$b$ are formed by disposing the three-sided recessed line portion 123$c$ on the three-sided outer peripheral surface 123 of the cover 120. The bottom side recessed line portion 136 is disposed on the long bottom side portion 134$d$ of the connector housing 131. The bottom side recessed line portion 136 and the three-sided recessed line portion 123$c$ constitute the annular recessed line portion where the second seal material 142 is annularly applied, and the annular protruded line portion 113$c$ of the base 110 is fitted into the annular recessed line portion. The widened gap portion 128 having the widened gap G2, which is the maximum gap dimension and is twice or more the seal gap G0, is formed outside the cover outer peripheral surface 123$a$ of the third side and the fourth side, which are parallel with the base opposite side, out of the three-sided outer peripheral surface 123. As described above, according to Claim 2 of this invention, the widened gap portion is added to the seal gap of the third side and the fourth side where the connector housing is not disposed, out of the seal gap for the annular second seal material, which is applied between the base and the cover. Therefore the second seal material, which flows out of the seal gap during the assembly step, is retained in the widened gap portion, and the outflowing to the surface of the base is prevented, hence the width of the outer peripheral surface of the cover can be narrowed.

The loosening prevention protrusion 121, which contacts the outer peripheral surface of the fastening surface 114$p$ of the base 110, is integrally molded to the inner periphery of each corner outer wall 122$a$ to 122$d$ disposed on the cover 120. As described above, according to Claim 3 of this invention, the loosening prevention protrusion is integrally molded to the inner periphery of each corner outer wall disposed on the cover (made of resin), so as to contact the outer peripheral surface of the fastening surface of the base. Therefore the value of the retention gap G1, formed between the base and the cover, can be controlled by the height of the loosening prevention protrusion, and if the base and the cover do not fit well due to the dimensional dispersion of each part, and if this dimension error is minor, the base and the cover can be easily fitted by scraping off the tip of the loosening prevention protrusion.

The loosening prevention protrusion 121, which contacts the outer peripheral surface of the fastening surface 114p of the base 110, is integrally molded to the inner periphery of the corner outer walls 122a and 122c connected at least to the connection outer wall 122ac, out of the corner outer walls 122a to 122d disposed on the cover 120, and the positioning protrusion 139 is integrally molded on the long bottom side portion 134d of the connector housing 131, and the positioning protrusion 139 is fitted in the fitting hole 119 disposed on one side of the outside outer peripheral surface 113a of the base 110. As described above, according to Claim 4 of this invention, the positioning protrusion is disposed on the long bottom side portion of the connector housing, and fits into the fitting hold disposed on one side of the base, and the loosening prevention protrusion is integrally molded to the inner periphery of each of the pair of corner outer walls in the cover (made of resin), so as to contact with the fastening surface of the base on the other side. Therefore the value of the retention gap G1 formed by the base and the cover can be controlled by the height of the loosening prevention protrusion, and if the base and the cover do not fit well due to the dimensional dispersion of each part, and if this dimensional error is minor, the base and the cover can be easily fitted by scraping off the tip of the loosening prevention protrusion.

The cover 120 includes the screw hole tubular portions 124a to 124d, where the fastening mating surface 124p and the fastening screw hole 124h are disposed, at each of the four corners, and the partition grooves 125a to 125d are disposed between the fastening mating surface 124p and the outside cover outer peripheral surface 123a, out of the three-sided outer peripheral surface 123. As described above, according to Claim 5 of this invention, the partition groove is disposed between the cover outer peripheral surface and the fastening mating surface, which have a step difference, inside each of the screw hole tubular portions disposed at the four corners of the cover. Therefore sinking of the thick portion can be prevented, and the flatness of the fastening surface can be improved. At the same time, in the case when the locking bond is applied to the fastening screw, the partition groove can also be used to accumulate bonding material.

The first depth D1 is determined so that the relationship between the first depth D1 of the fastening surface 114p, the second depth D2 of the base bottom surface 116, and the third depth D3 of the mounting legs 111a to 111d, with respect to the base outer peripheral surface 113 as a reference surface, is:

the third depth>the second depth>the first depth, and the tip of the screw head of the fastening screw 140 is the dimension of the second depth D2 or less. As described above, according to Claim 6 of this invention, the first depth of the fastening surface is determined so that the tip of the screw head of the fastening screw does not exceed the base bottom surface. Therefore the first depth is determined in a range where the screw head does not contact the mounted surface, and the bending strength of the fastening surface of the base can be obtained.

The cover 120 is a resin-molded product, and the heat transfer pedestal 115 is disposed in the base 110 (made of sheet metal) at a position facing the heat-generating component 137a mounted on the circuit board 130. The heat transfer pedestal 115 is disposed on one or on both of a pair of corners on the side where the connector housing 131 is not disposed, and the depth of the bottom surface of the heat transfer pedestal 115 is shallower than the base bottom surface 116, and the heat transfer adhesive 137b is applied to the inner side bottom surface of the heat transfer pedestal 115, so as to join with the circuit board 130 on which the heat-generating component 137a is mounted. As described above, according to Claim 7 of this invention, the heat transfer pedestal is disposed at the corner of the base in a position that is shallower than the base bottom surface, so that the heat generated in the heat-generating component, mounted on the circuit board, is transferred to the heat transfer pedestal via the heat transfer adhesive. Therefore the heat transfer pedestal is disposed at a position that is shallower than the base bottom surface, and the installation of the heat transfer pedestal does not change the weight of the base. As a consequence, the contour dimensions of the base does not change during press-fitting, and the positions of the fastening surface at the four corners become stable.

The annular protruded portion 117a is disposed at the center portion of the inner surface of the base bottom surface 116, and the circular water repellent filter 118 is adhered to the annular protruded portion 117a. The inlet 117b, which is open to outside air, is disposed on the rear face of the water repellent filter 118, and the water repellent filter 118 is a flat porous material, which includes a plurality of micro-pores through which air can freely pass, and can prevent the entry of water drops into the case body. As described above, according to Claim 8 of this invention, the annular protrusion, on which the water repellent filter is adhered, is disposed at the center portion of the base bottom surface, and the water repellent filter is open to the outside air via the inlet disposed on the base bottom surface. Therefore the outside air ventilates the case body when the temperature inside the case body changes, and damage to the seal member can be prevented. Further, the material for the annular protrusion that must be added is supplied by decreasing the thickness of the base inside the annular protrusion, the contour dimensions of the base does not change during press-fitting, and the positions of the fastening surfaces at the four corners become stable.

What is claimed is:

1. A waterproof type electronic apparatus unit, comprising a connector housing made of resin and including an opening portion and a body portion through which a mating connector is inserted/extracted, and a partition wall having a trapezoidal cross-section into which a plurality of connection terminals are press-fitted, wherein the connector housing is connected to a first side of a circuit board, with ends on one side of the connection terminals being bent toward a long bottom side of the partition wall;

the circuit board is sealed in an approximately square case body constituted by a base made of sheet metal, which has mounting legs on a third side and a fourth side intersecting orthogonally to the first side, and a cover made of resin, an end surface opening portion, which is a first side of the cover, has a trapezoidal shape, three surfaces of the trapezoid at the oblique sides, and the short top side of the trapezoidal shape are joined with the oblique sides and the short top side of the partition wall via a first seal material, and a second seal material is annularly applied to the long bottom side of the partition wall and a three-sided outer peripheral surface on the cover, so as to join with an annular base outer peripheral surface on the base; and the circuit board is held between a shelf portion disposed on the three-sided outer peripheral surface of the cover and the base outer peripheral surface, wherein the base includes a base bottom surface generated by embossing a center portion of a rectangular sheet metal material to be an approximately square shape with a second depth D2, a flange-shaped base outer peripheral surface which is a contour reference surface of the base bottom surface, and the mounting legs which are generated by bending base opposite sides, which are the third side and the fourth side of the base outer peripheral surface, in a direction toward the base bottom surface, with a third depth D3;

each of fastening surfaces disposed on the four corners of the base outer peripheral surface has a fastening hole into which a fastening screw is inserted for holding the three sides of the circuit board, excluding the first side, between the cover and the base;

the fastening surfaces are embossed toward the direction opposite to the base bottom surface with a first depth D1, to contact the fastening mating surfaces disposed on the cover, thereby generating a seal gap G0 of the second seal material;

the cover includes the three-sided outer peripheral surface, excluding the end surface opening portion, fastening the screw holes into which the fastening screws are screwed, and an outer wall;

the outer wall includes corner outer walls which face the two surfaces on the outer periphery of the fastening surfaces, and a connection outer wall disposed between a pair of corner outer walls located on opposite sides of the end surface opening portion, out of the corner walls;

the connector housing includes an annular outer wall which faces the first side of the base and the end surface opening portion of the cover;

the first side and the second side, which is the opposite side of the first side, of the base constitute a retention gap G1 with respectively the annular outer wall and the outer wall so as to prevent the outflow of the second seal material; and the annular outer wall constitutes a retention gap G1 with the end surface opening portion of the cover so as to prevent outflow of the first seal material.

2. The electronic apparatus unit according to claim 1, wherein the base outer peripheral surface is divided into an outside outer peripheral surface and an inside outer peripheral surface by an annular protruded line portion that is embossed in the direction opposite to the base bottom surface, outside and inside cover outer peripheral surfaces are formed by disposing a three-sided recessed line portion on the three-sided outer peripheral surface of the cover, a bottom side recessed line portion is disposed on the long bottom side portion of the connector housing, the bottom side recessed line portion and the three-sided recessed line portion constitute an annular recessed line portion where the second seal material is annularly applied, and the annular protruded line portion of the base is fitted into the annular recessed line portion, and a widened gap portion having a widened gap G2, which is a maximum gap dimension and exceeds double the seal gap G0, is formed outside the cover outer peripheral surface of the third side and the fourth side, which are parallel with the base opposite side, out of the three-sided outer peripheral surface.

3. The electronic apparatus unit according to claim 2, wherein a loosening prevention protrusion, which contacts the outer peripheral surface of the fastening surface of the base, is integrally molded on the inner periphery of each of the corner outer walls disposed on the cover.

4. The electronic apparatus unit according to claim 2, wherein a loosening prevention protrusion, which contacts the outer peripheral surface of the fastening surface of the base, is integrally molded on the inner periphery of each of the corner outer walls connected at least to the connection outer wall, out of the corner outer walls disposed on the cover, and a positioning protrusion is integrally molded on the long bottom side portion of the connector housing, and the positioning protrusion is fitted in a fitting hole disposed on one side of the outside outer peripheral surface of the base.

5. The electronic apparatus unit according to claim 2, wherein the cover includes a screw hole tubular portion, where the fastening mating surface and the fastening screw hole are disposed, at each of the four corners of the cover, and a partition groove is disposed between the fastening mating surface and the outside cover outer peripheral surface, out of the three-sided outer peripheral surface.

6. The electronic apparatus unit according to claim 2, wherein the first depth D1 is determined so that relationship between the first depth D1 of the fastening surface, the second depth D2 of the base bottom surface, and the third depth D3 of the mounting legs, with respect to the base outer peripheral surface as a reference surface, is the third depth >the second depth >the first depth, and a tip of a screw head of the fastening screw is a dimension of the second depth D2 or less.

7. The electronic apparatus unit according to claim 2, wherein the cover is a resin molded product, and a heat transfer pedestal is disposed in the base made of sheet metal at a position facing a heat-generating component mounted on the circuit board, and the heat transfer pedestal is disposed on one or on both of a pair of corners on the side where the connector housing is not disposed, a depth of the bottom surface of the heat transfer pedestal is shallower than the base bottom surface, and a heat transfer adhesive is applied to the inner side bottom surface of the heat transfer pedestal, so as to join with the circuit board on which the heat-generating component is mounted.

8. The electronic apparatus unit according to claim 2, wherein an annular protruded portion is disposed at the center portion of the inner surface of the base bottom surface, a circular water repellent filter is adhered to the annular protruded portion, and an inlet port, which is open to the outside air, is disposed on a rear face of the water repellent filter, and the water repellent filter is a flat porous material which includes a plurality of micro-pores through which air can freely pass, and prevents entry of water drops into the case body.

9. The electronic apparatus unit according to claim 1, wherein a loosening prevention protrusion, which contacts the outer peripheral surface of the fastening surface of the base, is integrally molded on the inner periphery of each of the corner outer walls disposed on the cover.

10. The electronic apparatus unit according to claim 1, wherein the first depth D1 is determined so that relationship between the first depth D1 of the fastening surface, the second depth D2 of the base bottom surface, and the third depth D3 of the mounting legs, with respect to the base outer peripheral surface as a reference surface, is the third depth >the second depth >the first depth, and a tip of a screw head of the fastening screw is a dimension of the second depth D2 or less.

11. The electronic apparatus unit according to claim 1, wherein the cover is a resin molded product, and a heat transfer pedestal is disposed in the base made of sheet metal at a position facing a heat-generating component mounted on the circuit board, and the heat transfer pedestal is disposed on one or on both of a pair of corners on the side where the connector housing is not disposed, a depth of the bottom surface of the heat transfer pedestal is shallower than the base bottom surface, and a heat transfer adhesive is applied to the inner side bottom surface of the heat transfer pedestal, so as to join with the circuit board on which the heat-generating component is mounted.

12. The electronic apparatus unit according to claim 1, wherein an annular protruded portion is disposed at the center portion of the inner surface of the base bottom surface, a circular water repellent filter is adhered to the annular protruded portion, and an inlet port, which is open to the outside air, is disposed on a rear face of the water repellent filter, and the water repellent filter is a flat porous material which includes a plurality of micro-pores through which air can freely pass, and prevents entry of water drops into the case body.

\* \* \* \* \*